(12) United States Patent
Wasson

(10) Patent No.: US 6,333,641 B1
(45) Date of Patent: Dec. 25, 2001

(54) APPARATUS AND METHODS FOR DYNAMICALLY DEFINING VARIABLY SIZED AUTONOMOUS SUB-ARRAYS WITHIN A PROGRAMMABLE GATE ARRAY

(75) Inventor: Stephen L. Wasson, Boulder Creek, CA (US)

(73) Assignee: Morphics Technology, Inc., Campbell, CA (US)

( * ) Notice: Subject to any disclaimer, the term of this patent is extended or adjusted under 35 U.S.C. 154(b) by 0 days.

(21) Appl. No.: 09/565,651

(22) Filed: May 5, 2000

Related U.S. Application Data
(60) Provisional application No. 60/133,138, filed on May 7, 1999.

(51) Int. Cl.[7] .................................................. H03K 19/177
(52) U.S. Cl. ................................ 326/39; 326/41; 326/38
(58) Field of Search ............................................. 326/37–41

(56) References Cited

U.S. PATENT DOCUMENTS

| | | | |
|---|---|---|---|
| 4,935,734 | 6/1990 | Austin | 340/825.83 |
| 5,329,470 | 7/1994 | Sample et al. | 364/578 |
| 5,455,525 | 10/1995 | Ho et al. . | |
| 5,541,530 | 7/1996 | Cliff et al. . | |
| 5,703,498 | 12/1997 | Gould et al. . | |
| 5,796,623 | 8/1998 | Butts et al. | 364/489 |
| 5,894,228 | 4/1999 | Reddy et al. . | |
| 5,903,165 | 5/1999 | Jones et al. . | |
| 5,943,242 | 8/1999 | Vorbach et al. | 364/491 |
| 5,946,219 | 8/1999 | Mason et al. | 364/489 |
| 5,963,049 | 10/1999 | Cliff et al. . | |
| 5,999,016 | 12/1999 | McClintock et al. . | |
| 6,021,490 | 2/2000 | Vorbach et al. | 713/100 |
| 6,075,380 | 6/2000 | Lane . | |

FOREIGN PATENT DOCUMENTS

| | | |
|---|---|---|
| WO98/21725A2 | 5/1998 | (WO) . |
| WO99/56394A1 | 11/1999 | (WO) . |

Primary Examiner—Michael Tokar
Assistant Examiner—Don Phu Le
(74) Attorney, Agent, or Firm—Pennie & Edmonds LLP

(57) ABSTRACT

A programmable logic device includes an array of logic modules. A standard interconnection grid, with vertical routing lines, horizontal routing lines, and local routing lines, links the array of logic modules. An omniversal bus is positioned over the array of logic modules. The array of logic modules includes selective links to the omniversal bus, such that the omniversal bus dynamically establishes autonomous sub-arrays of logic modules of variable size attached to the omniversal bus.

11 Claims, 10 Drawing Sheets

APPARATUS AND METHODS FOR DYNAMICALLY DEFINING VARIABLY SIZED AUTONOMOUS SUB-ARRAYS WITHIN A PROGRAMMABLE GATE ARRAY

This application claims priority to the provisional application bearing Ser. No. 60/133,138 filed on May 7, 1999.

BRIEF DESCRIPTION OF THE INVENTION

This invention relates generally to programmable digital logic. More particularly, this invention relates to a technique for dynamically defining variably sized autonomous sub-arrays within a programmable gate array.

BACKGROUND OF THE INVENTION

Existing programmable logic devices do not provide a mechanism to maintain the autonomy of programmed functions especially when the functions are independently designed. Moreover, existing programmable logic devices do not provide dedicated bus routing resources for such programmed functions. Routing resources used for busing in existing programmable logic devices are typically uni-dimensional; namely, the routing resources are capable of conveying signals along one axis, but not along both axes. FIG. 1 illustrates exemplary prior art routing architectures in programmable logic devices. A programmable logic device 100 implemented a s a standard field programmable gate array (FPGA) includes vertical routing lines 101 and horizontal routing lines 104 interconnected to logic modules 102 via local routing lines or interconnect 103.

Current FPGA hierarchical routing relies upon segment lengths from short local routes (e.g., interconnect 103) to chip-wide long routes (e.g., vertical routing lines 101 and horizontal routing lines 104) to interconnect the various modules 102. This routing hierarchy does not allow functions of variable size to be autonomously implemented in modules 102.

Some FPGAs are equipped with chip-wide 3-state route resources which are commonly used for bussing. However, these 3-state resources are limited to bussing in one direction, either horizontally or vertically, but not both. Even in devices that contain 3-state resources in both dimensions (horizontally and vertically), such 3-state resources still do not interconnect. Moreover, these routing resources are not dedicated for busing.

Because of the undedicated nature of the conventional interconnect 101 and 104, functions implemented across several modules 102 will incur performance degradation. Furthermore, autonomous functions that have logic commingled within a module 102 will incur additional performance degradation. Performance degradation due to the commingling of disparate logic is a significant obstacle in merging autonomous functions.

In view of the foregoing, it would be highly desirable to provide a mechanism for grouping bussed resources that is capable of simultaneously interconnecting logic modules in both a conventional local/global approach and in a bussed manner between local modules. Such a technique would allow function autonomy after merging.

SUMMARY OF THE INVENTION

The apparatus of the invention includes a programmable logic device comprising an array of logic modules, a standard interconnection grid, with vertical routing lines, horizontal routing lines, and local routing lines, and an omniversal bus functionally positioned over the array of logic modules. The array of logic modules includes selective links to the omniversal bus, such that the omniversal bus dynamically establishes autonomous sub-arrays of logic modules of variable sizes functionally attached to the omniversal bus. The omniversal bus of this invention is capable of transporting signals bi-directionally along both axes.

The non-segmented, programmable "omniversal" bus of the invention facilitates subdividing the module array into locally autonomous programmable sub-arrays. Each sub-array can be independently designed, optimized, mapped, placed, and routed. Individual sub-arrays may be of varying sizes and may be merged incrementally. For example, large designs (>250K gates) and very large designs (>1M gates) can be subdivided into manageable functions for autonomous implementation. During subsequent merging, autonomous function performance characteristics are maintained. Thus, independent third-party functions and other disparate functions can be seamlessly merged.

The omniversal bus is functionally connected to the logic modules via docking ports. In an exemplary embodiment, a docking port includes two kinds of resources: (1) point-to-point interconnect; and (2) collective interconnect. Point-to-point interconnect ("point interconnect") allows a one-to-one correspondence of nodes among docking ports. Collective interconnect allows a one-to-n correspondence among docking ports. Point interconnect comprises a plurality of nodes. A point interconnect node can be connected to multiple collective interconnects for receiving various control signals. Point interconnect provides general address and data conveyance, whereas collective interconnect provides control.

DETAILED DESCRIPTION OF THE INVENTION

Figure 1:
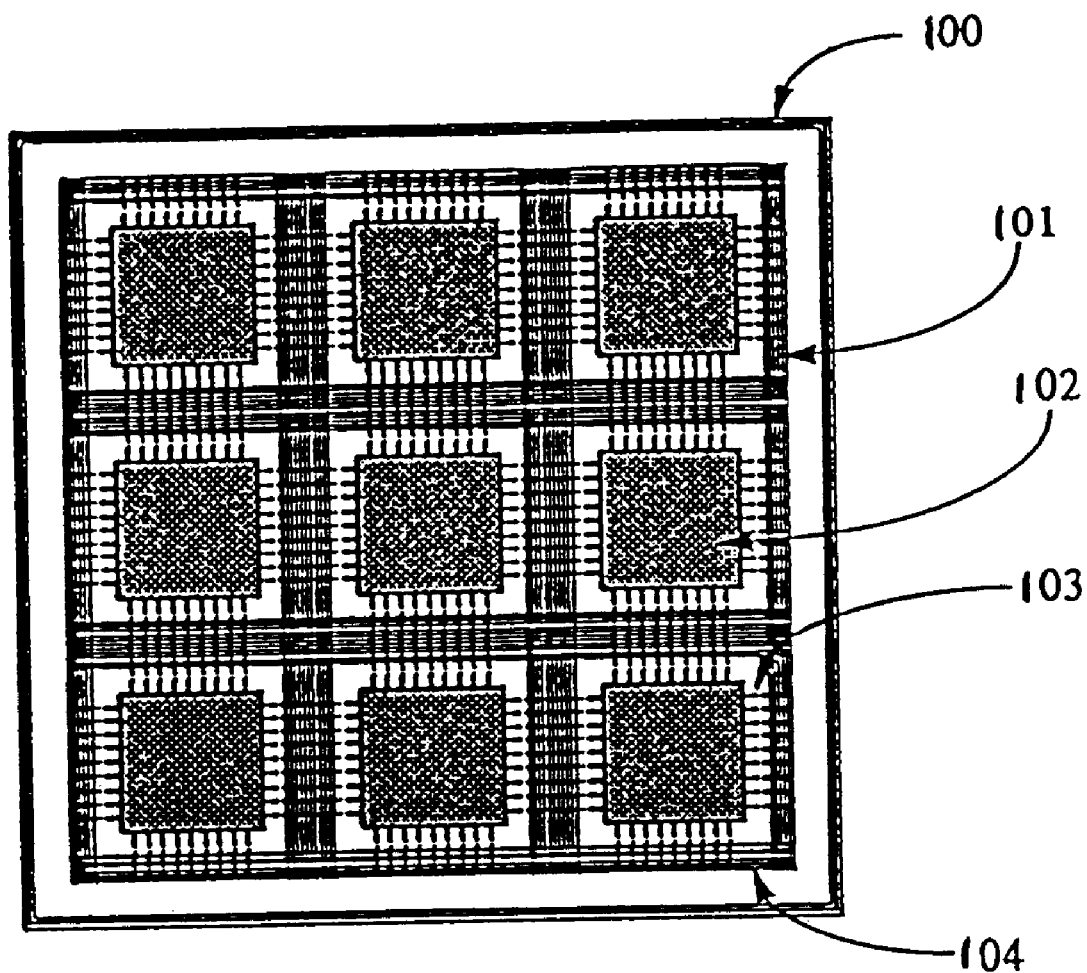
FIG. 1 illustrates a Field Programmable Gate Array interconnect structure in accordance with the prior art.
Figure 2:
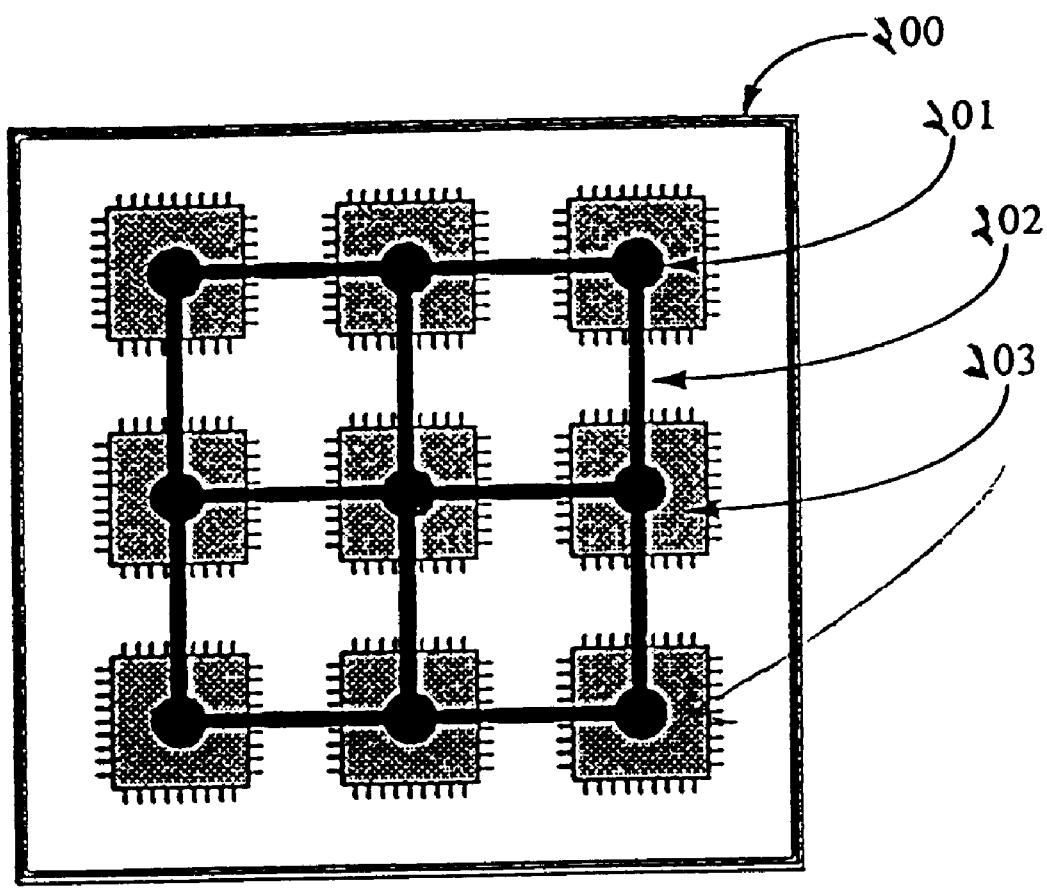
FIG. 2 illustrates an omniversal bus structure utilized in accordance with an embodiment of the invention.

FIG. 2 illustrates a programmable logic device 200 having an array of programmable logic modules 203 functionally interconnected by an omniversal bus 202 constructed in accordance with an embodiment of the invention. Although not shown in FIG. 2, it should be appreciated that the programmable logic modules 203 are also interconnected by standard segmented hierarchical routing segments of the type shown in FIG. 1 (i.e., the vertical routing lines 101, the horizontal routing lines 104, and the local routing lines 103). In accordance with the invention, the omniversal bus 202 is utilized as an additional interconnect resource.

Each logic module 203 is functionally connected via a docking port 201 to the omniversal bus 202. In an exemplary embodiment, the docking port 201 includes input/output logic that enables the omniversal bus 202 to convey data into and out of each connected programmable logic module 203. FIG. 2 illustrates nine logic modules 203, each with a dedicated docking port 201. The interconnect to the docking ports 201 from each logic module 203 is programmable; that is, each logic module 203 may optionally provide output to and/or derive input from the omniversal bus 202.

Configuring a logic module 203 to interconnect to a docking port 201 joins that logic module to the bus 202; therefore, such a module is said to be independent of standard local interconnect resources. Logic modules 203 which are not joined via docking ports 201 to the bus 202 are said to be dependent; that is, dependent logic modules 203 must use standard local interconnect. A cluster of logic modules 203 inclusive of one or more independent logic modules 203 is an autonomous sub-array.

Figure 3:
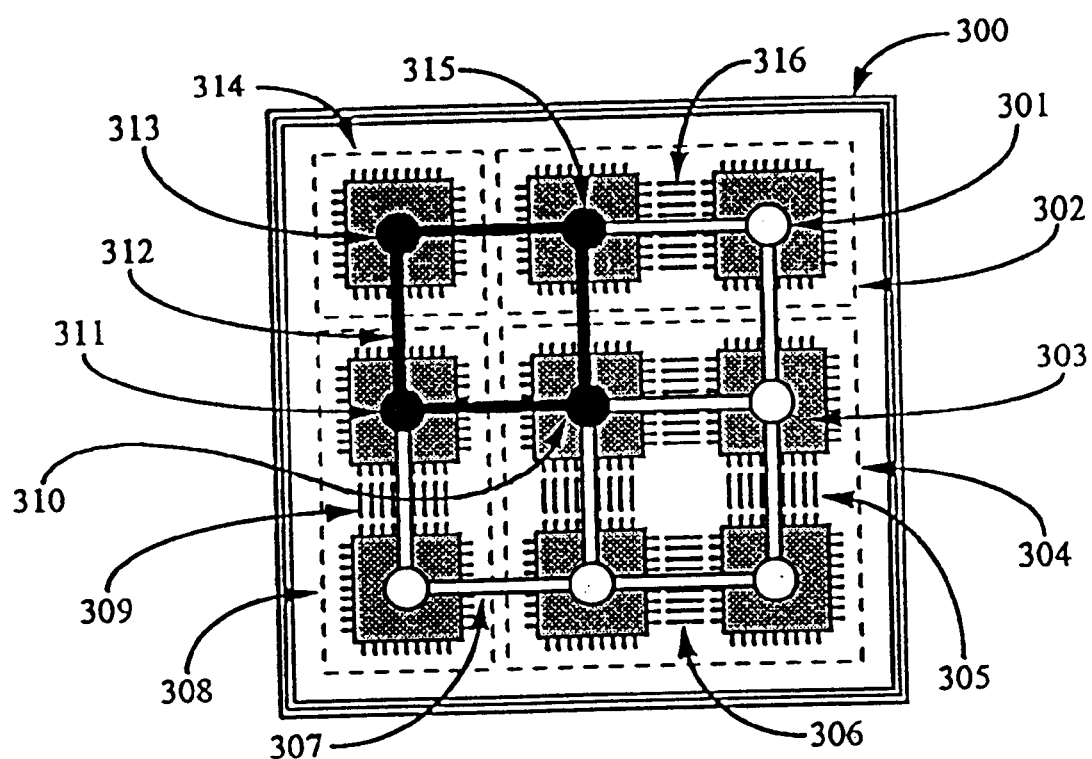
FIG. 3 illustrates an omniversal bus structure utilized to implement an array of locally autonomous programmable sub-arrays in accordance with an embodiment of the invention.

FIG. 3 depicts a Variable Programmable Gate Array (VPGA) 300 in accordance with an embodiment of the invention. The VPGA 300 includes nine logic modules 303. In this depiction, a first sub-array 302 is comprised of two horizontally adjacent logic modules 303. The adjacent logic modules 303 in the first sub-array 302 are interconnected by local routing lines 316. A second sub-array 304 is comprised of four logic modules 303. The adjacent logic modules 303 in the second sub-array 304 are interconnected by local routing lines 305 and 306. A third sub-array 308 is comprised of two vertically adjacent logic modules 303. The adjacent logic modules 303 in the third sub-array 308 are interconnected by local routing lines 309. A fourth sub-array 314 is comprised of a single logic module 303. Omnibus connections are made via active docking port 315 in the first sub-array 302, via active docking port 310 in the second sub-array 304, via active docking port 311 in the third sub-array 308, and via active docking port 313 in the fourth sub-array 314. Thus, regardless of the size or arrangement within a particular sub-array, multiple sub-arrays can be efficiently connected by using omnibus connections where each sub-array is functionally connected to another sub-array by an active docking port. The darkened portion of the omnibus 312 defines the active interconnect between the four autonomous sub-arrays, 314, 302, 304, and 308.

Figure 4:
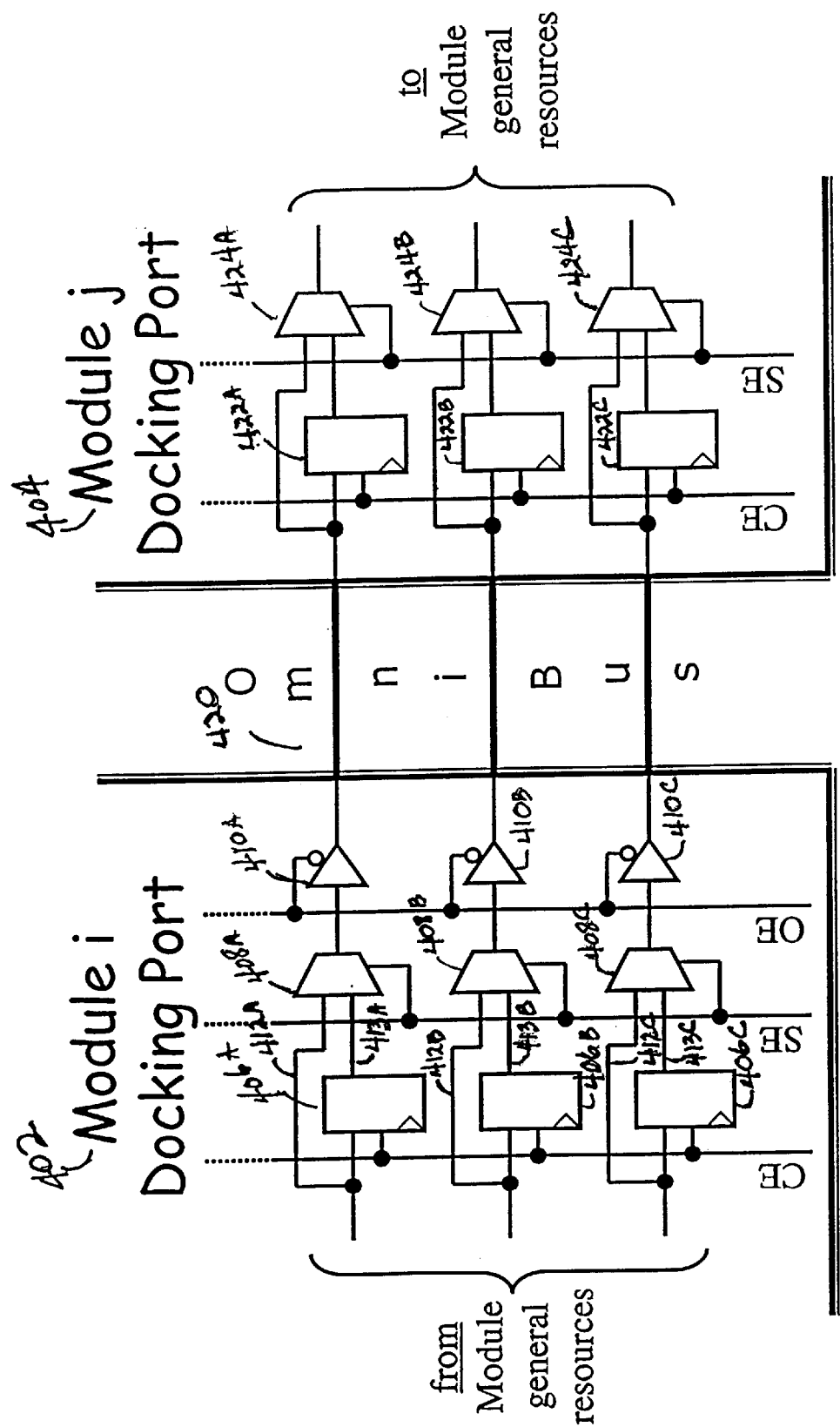
FIG. 4 illustrates exemplary docking ports in accordance with an embodiment of the invention.

FIG. 4 illustrates exemplary docking ports 402 and 404. The docking port for module "i" 402 includes a plurality of flip-flops 406, multiplexers 408, and three-state drivers 410. The docking port 402 receives input signals from the general resources of module "i." The input signals are selectively latched into the flip-flops in response to the clock enable signal (CE). A select enable signal (SE) applied to the multiplexers 408 determines which signal is driven as an output from the multiplexers, either the currently received signal from the general resources of module "i" on line 412 or a received signal from the a previous state of the general resources of module "i" on line 413. An output enable signal (OE) applied to the three-state buffers 410 drives the signals from the multiplexers 408 onto the omnibus 420.

The signals from the omnibus 420 are then applied to module 404. In particular, the signals are selectively latched into flip-flops 422 in response to a clock enable signal (CE). The select enable signal (SE) is then used to select the input signals of the multiplexers 424. The signals applied to the general resources of module "j" are either the current signals from the omnibus 420 or previous state signals from the omnibus 420.

Thus, FIG. 4 illustrates a docking port architecture that enables autonomous sub-arrays to be formed between different modules (e.g., 402 and 404). These routing resources supplement the standard routing resources associated with the device. Although FIG. 4 illustrates exemplary docking ports for processing and transmitting inputs from module "i" to module "j," the docking ports are capable of functioning bi-directionally, namely, processing and transmitting inputs from either module "j" or module "i."

Figure 5:
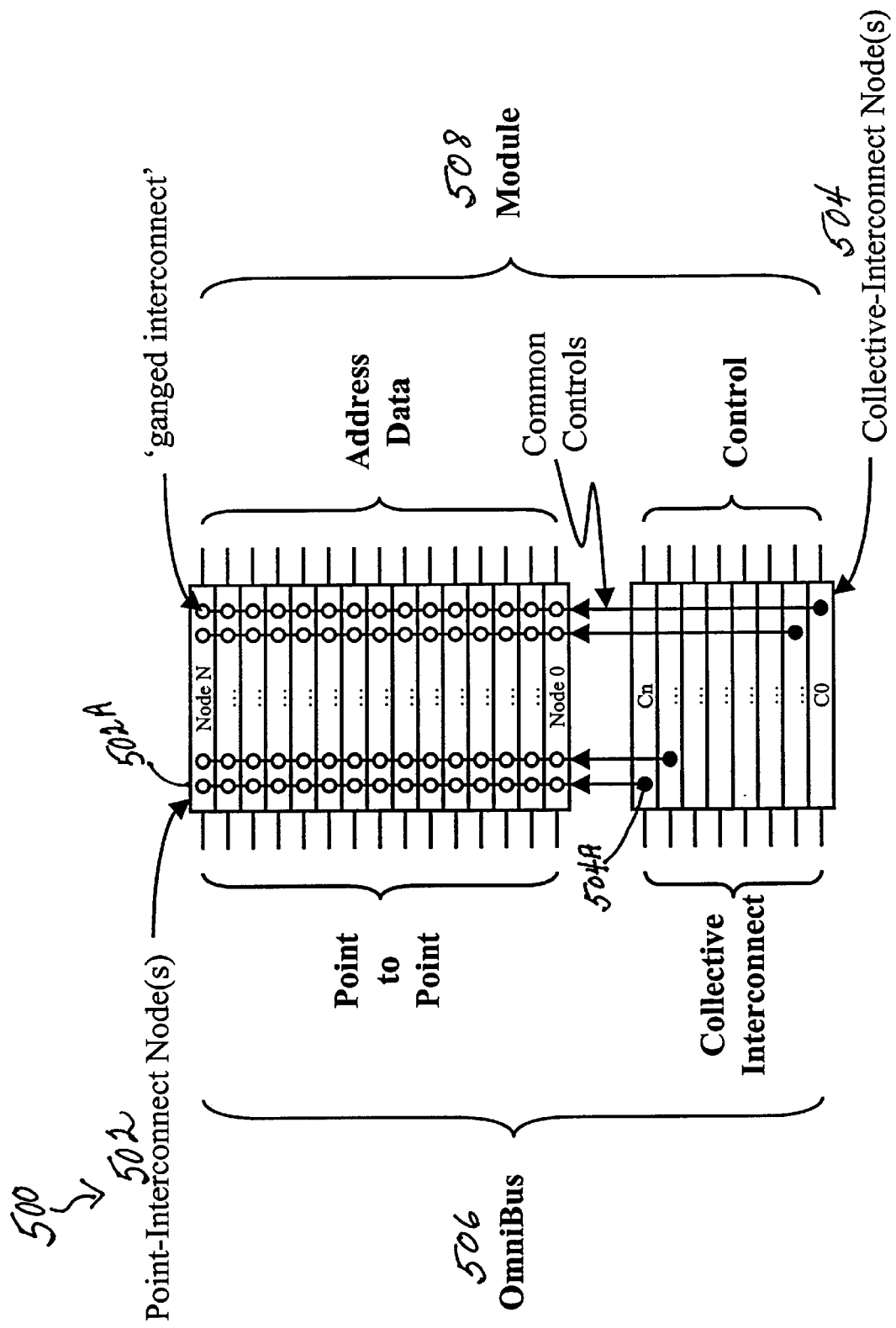
FIG. 5 illustrates an exemplary docking port in accordance with another embodiment of the invention.

FIG. 5 illustrates an exemplary docking port 500 in accordance with an embodiment of the invention. The docking port 500 includes a plurality of point interconnect nodes 502 and a plurality of collective interconnect nodes 504. As shown in FIG. 5, the docking port 500 includes "N" point interconnect nodes 502 and "n" collective interconnect nodes. Point interconnect nodes 502 in the docking port 500 have a one-to-one correspondence with point interconnect nodes in other docking ports. Collective interconnect nodes 504 have a one-to-N correspondence with point interconnect nodes in other docking ports; namely, a collective interconnect node 504 in docking port 500 can control up to "N" point interconnect nodes in the illustrated docking port 500 or other docking ports. N is a fixed number which is designed into a programmable device. Each collective interconnect node 504 in the docking port 500 connects to a plurality of point interconnect nodes 502 in the docking port 500. The point interconnect nodes 502A that are connected to a common collective interconnect node 504A are grouped by that common collective interconnect node 504A. For example, when the common interconnect node 504A is enabled, all of the grouped point interconnect nodes 502A are enabled at the same time. In a preferred embodiment, a group of point interconnect nodes 502A controlled by a common collective interconnect node 504A cannot be re-grouped. A point interconnect node 502 can be connected to multiple collective interconnects 504 for receiving various control signals. Examples of control signals provided by collective interconnect nodes are output-enable, input-enable, output-clock-enable, and input-clock-enable.

In an exemplary embodiment, each point interconnect node 502 has a connection to an omniversal bus 506, a connection to a module 508, and a collection of connections to collective interconnect nodes 504. Specifically, the connections to the omniversal bus and the module are equivalent to address or data lines, such that each node has a connection to the omniversal bus and the module. Each collective interconnect node has a connection to the omniversal bus 506 and a connection to the module 508 and a connection to "N" point interconnect nodes 502. The collective interconnect nodes 504 are dynamic; namely, the collective interconnect nodes can be asserted and de-asserted during operation. Further, collective interconnects may be controlled by static signals such as configuration programming bits.

Figure 6:
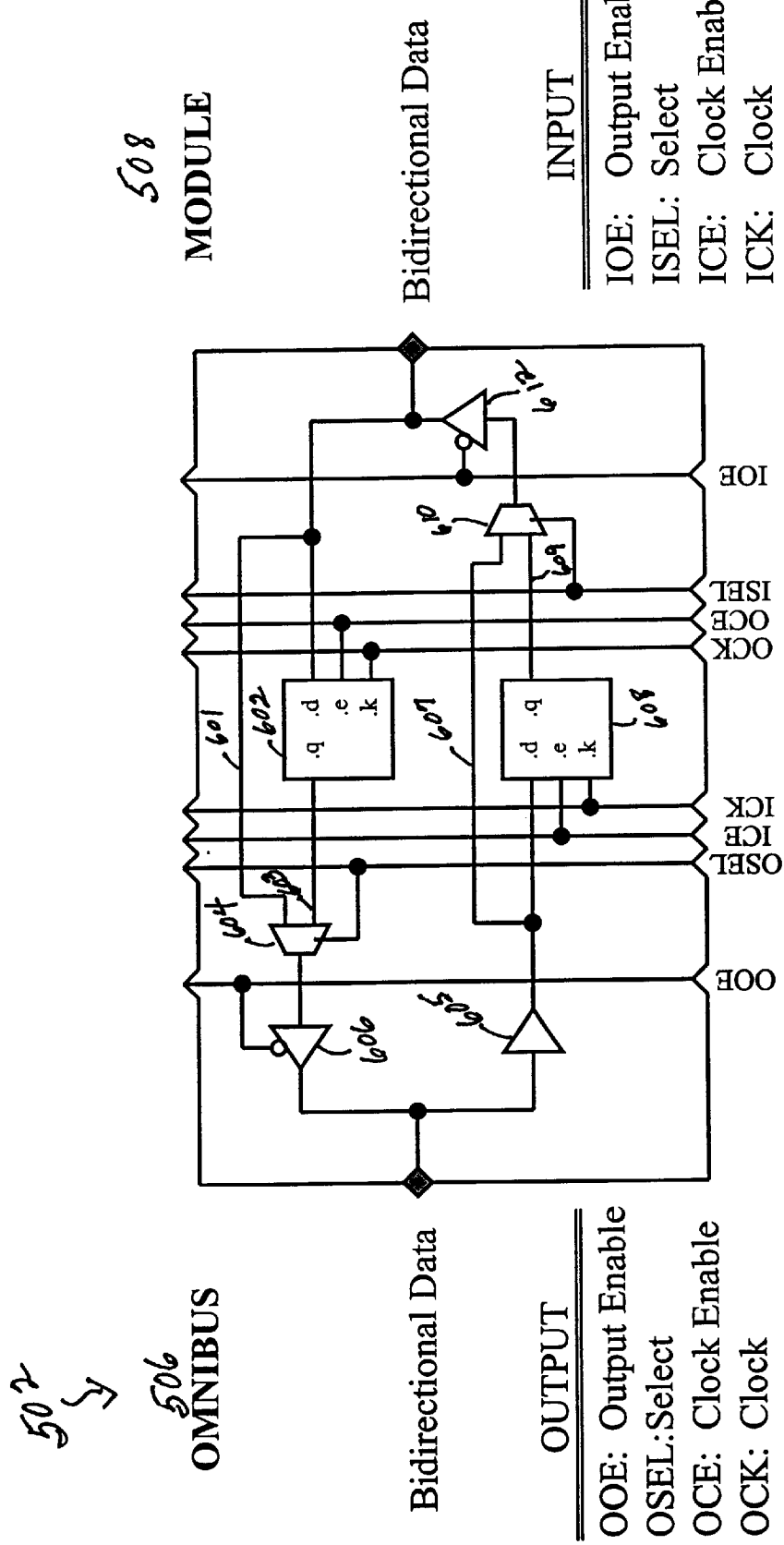
FIG. 6 illustrates an exemplary docking port point interconnect node in accordance with an embodiment of the invention.

FIG. 6 illustrates an exemplary docking port point interconnect node 502. The exemplary point interconnect node is connected bidirectionally to an omniversal bus 506 and a module 508. In an exemplary embodiment, the docking port 502 receives input signals from general resources of the module 508. The input signals are selectively latched into a flip-flop 602 in response to a clock enable signal (OCE) or a clock signal (OCK). A select enable signal (OSEL) applied to a multiplexer 604 determines which signal is driven as an output from the multiplexer 604, either the currently received signal from general resources of the module 508 on line 601 or a received signal from a previous state of general resources of the module on line 603. An output enable signal (OOE) applied to the three-state buffer 606 drives the signal from the multiplexer 604 onto the omnibus 506. In another exemplary embodiment, the docking port 502 receives input signals from general resources of the omniversal bus 506. Input signals are initially stored in a buffer 605 and are then selectively latched into a flip-flop 608 in response to a clock enable signal (ICE) or a clock signal (ICK). A select enable signal (ISEL) applied to a multiplexer 610 determines which signal is driven as an output from the multiplexer 610, either the currently received signal from the omniversal bus 506 on line 607 or a received signal from a previous state of the omniversal bus 506 on line 609. An output enable signal (IOE) applied to the three-state buffer 612 drives the signal from the multiplexer 610 into the module 508.

Figure 7:
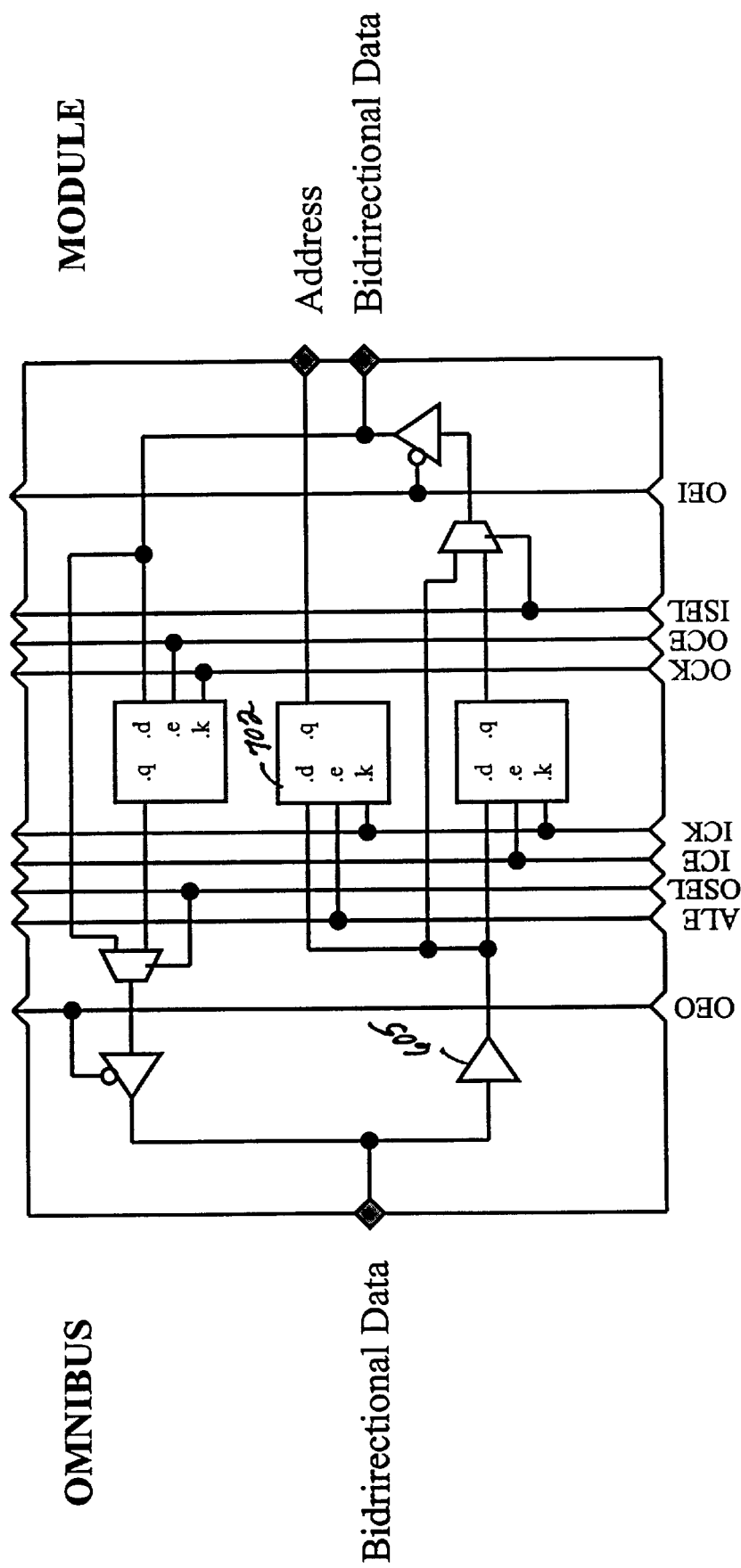
FIG. 7 illustrates an exemplary docking port point interconnect node in accordance with another embodiment of the invention.

FIG. 7 illustrates another exemplary embodiment of a docking port point interconnect node 502. The embodiment in FIG. 7 is essentially the same as the embodiment in FIG. 6 except an address from the omniversal bus 506 is selectively latched into a flip-flop 702 in response to a clock signal (ICK) or an address latch enable signal (ALE). The address at the flip-flop 702 is provided to the module 508 in addition to providing data signals as described above.

Figure 8:
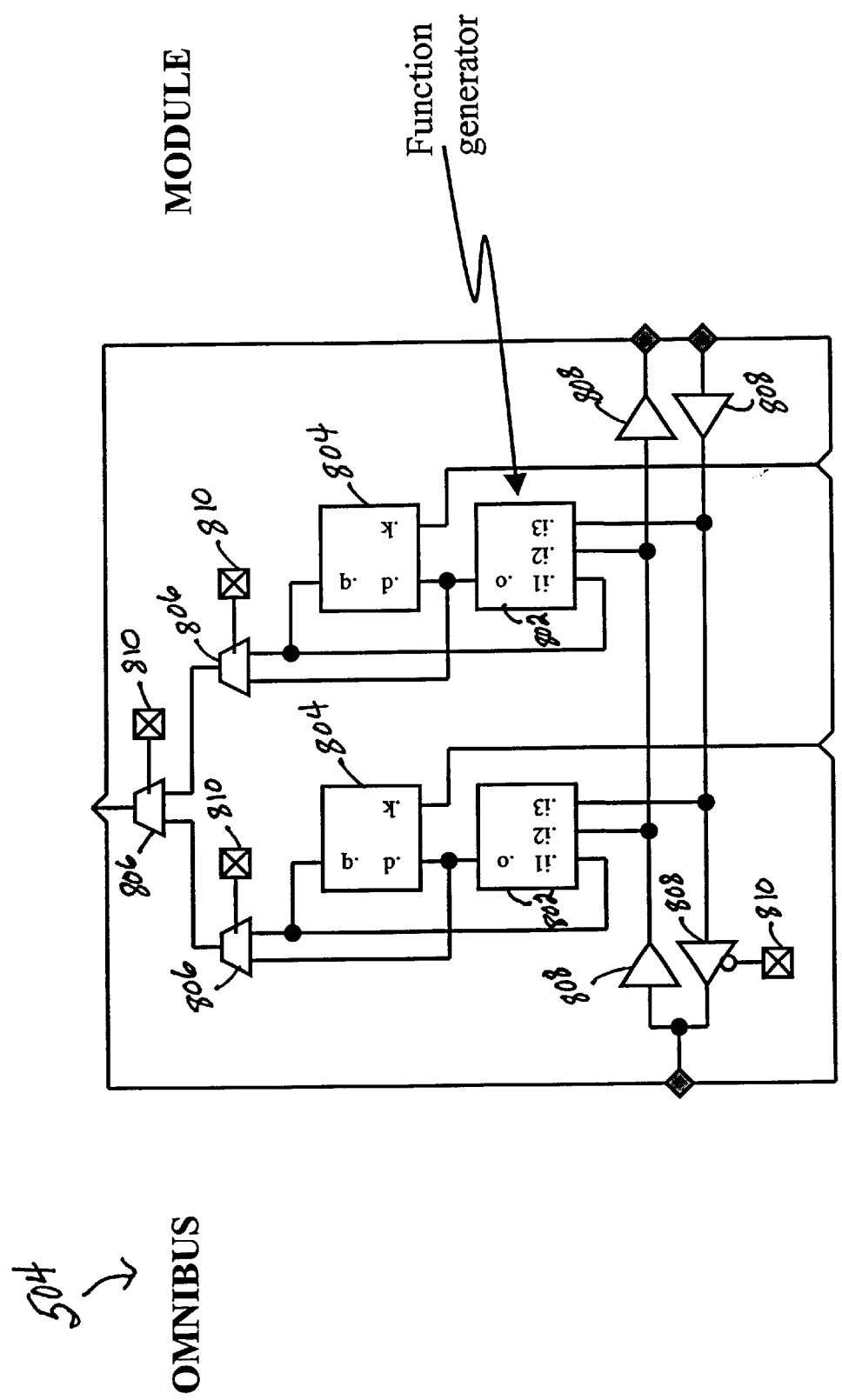
FIG. 8 illustrates an exemplary docking port collective interconnect node in accordance with another embodiment of the invention.
Figure 9:
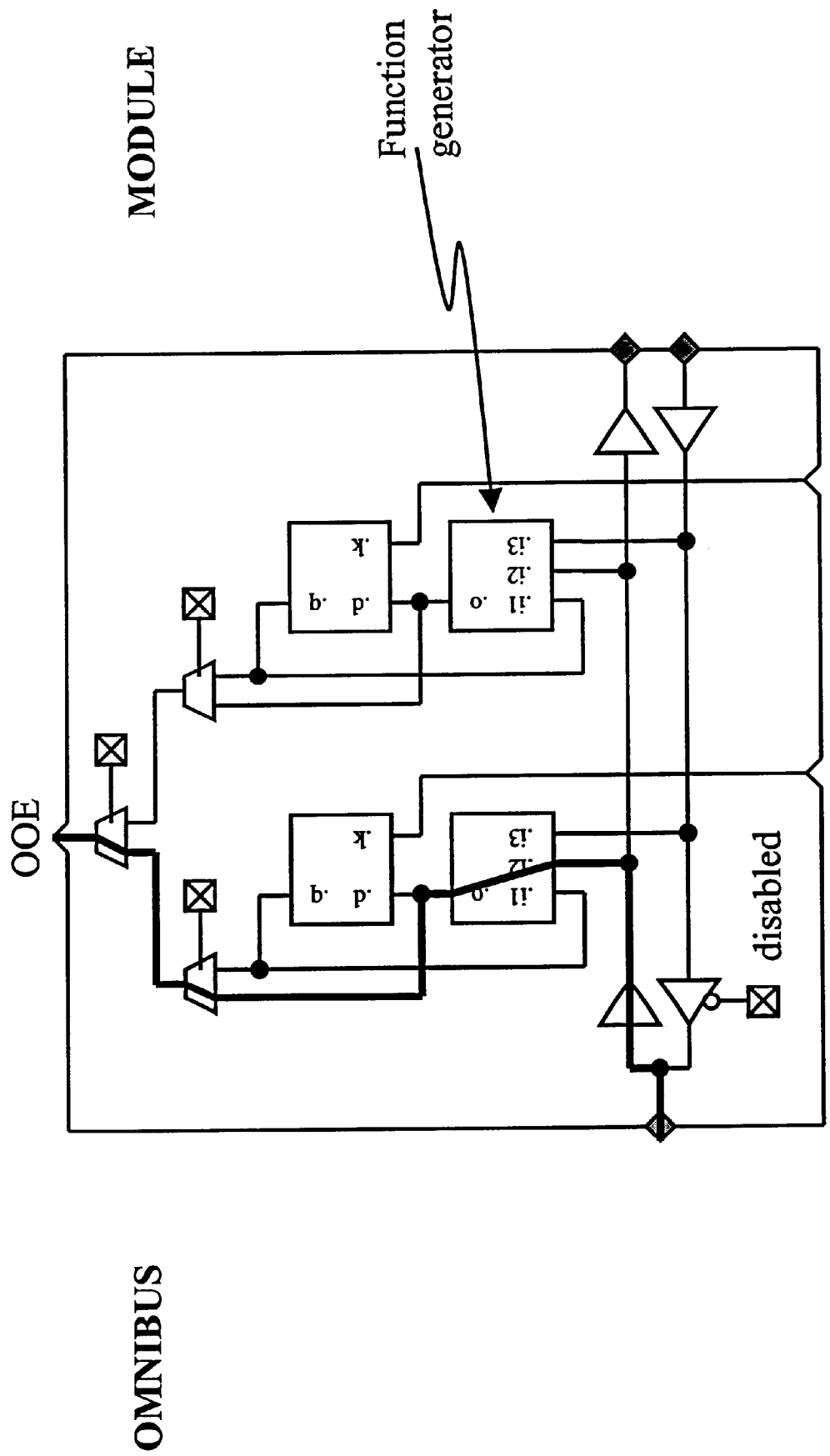
FIG. 9 illustrates another exemplary docking port collective interconnect node in accordance with an embodiment of the invention.

FIG. 8 illustrates an exemplary VPGA docking port collective interconnect node 504. The collective interconnect node 504 is responsible for generating a docking port collective control signal. The collective interconnect node 504 includes function generators 802, flip-flops 804, multiplexers 806, buffers 808, and configuration points 810 as necessary to affect input or output control. In an exemplary embodiment, if a receiving module is a 'slave' or target module, then the output enable signal (OOE) is provided directly from a 'master' module. This may be accomplished by configuring the collective interconnect node responsible for generating the output enable signal as an 'input' node. For example, the input function generator 802 is configured to a pass-through mode which allows a signal to travel through unaltered. In addition, corresponding multiplexers 806 should be configured to convey the input line. FIG. 9 illustrates an exemplary embodiment of a collective interconnect node set up in a slave mode.

Figure 10:
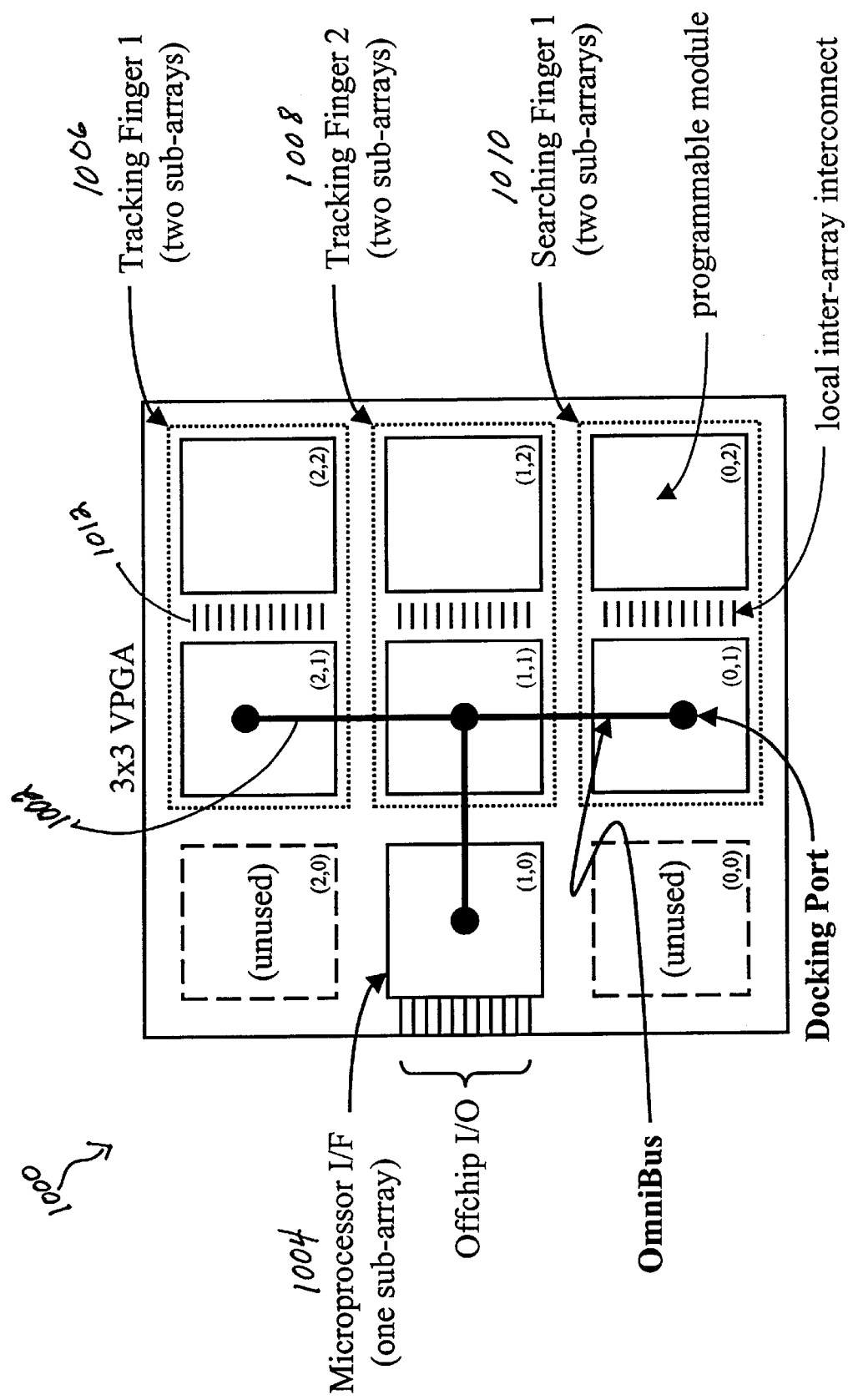
FIG. 10 illustrates an exemplary VPGA device in accordance with an embodiment of the invention.

FIG. 10 illustrates an exemplary VPGA 1000 having a three CDMA (code division multiplexing array) fingers functionally interconnected by an omniversal bus 1002. A 3×3 VPGA 1000 is partitioned into four functions: (1) a microprocessor interface 1004; (2) two tracking fingers 1006, 1008; and (3) one searching finger 1010. The microprocessor interface 1004 is allocated to a single module (1,0). The tracking finger 1006 is allocated to two modules (2,1) and (2,2). The tracking finger 1008 is allocated to two modules (1,1) and (1,2). The searching finger 1010 is allocated to two modules (0,1) and (0,2). Each two-module sub-array 1006, 1008, 1010 is interconnected using local inter-array interconnect 1012. The four sub-arrays are functionally interconnected by the omniversal bus 1002. The omniversal bus 1002 is configured such that the microprocessor interface 1004 is always the bus master, and the three fingers 1006, 1008, 1010 are always slaves. In an exemplary embodiment, a 16-bit bus emulating a well-known PC ISA bus standard is used.

In an exemplary embodiment the omniversal bus 1002 can be physically designed (in silicon) to permit finer granularity partitioning such that, instead of controlling all of the point interconnect nodes in common, the point interconnect nodes are controlled in groups (i.e., 16-bit groups). Multiple omniversal buses can accommodate full-duplex communications and increases on-chip data throughput.

In sum, the architecture of the invention comprises an array of locally autonomous programmable sub-arrays globally interconnected with an omniversal bus. Physically adjacent sub-arrays may be concatenated to create larger sub-arrays. Sub-arrays are functionally interconnected to the omnibus through locally programmable docking ports. The omniversal bus specification may be user-definable. For example, as shown in FIG. 4, the CE, SE, and OE signals may be used to establish various connections between different modules. Sub-arrays need not comprise the same logic resource type, e.g., sub-arrays may be reconfigurable memory, controller, or other resource logic.

Those skilled in the art will recognize a number of benefits associated with the technique of the invention. First, the non-segmented, programmable omniversal bus of the invention facilitates an array of locally autonomous programmable sub-arrays. Each sub-array can be independently designed, optimized, mapped, placed, and routed. Individual sub-arrays may be of varying sizes and may be merged incrementally. For example, large designs (>250K gates) and very large designs (>1M gates) can be subdivided into manageable modules for autonomous implementation. During subsequent merging, autonomous module performance characteristics are maintained. Thus, independent third-party modules and other disparate modules can be seamlessly merged.

The foregoing examples illustrate certain exemplary embodiments of the invention from which other embodiments, variations, and modifications will be apparent to those skilled in the art. The invention should therefore not be limited to the particular embodiments discussed above, but rather is defined by the following claims.

What is claimed is:

1. A programmable logic device, comprising:
   an array of logic modules;
   a standard interconnection grid linking said array of logic modules, said standard interconnection grid including vertical routing lines, horizontal routing lines, and local routing lines; and
   an omniversal bus adjacent to said array of logic modules, said array of logic modules including selective links to said omniversal bus such that said omniversal bus dynamically establishes variably sized autonomous sub-arrays of logic modules attached to said omniversal bus.

2. The programmable logic device of claim 1, wherein said selective links include a docking port.

3. The programmable logic device of claim 2, wherein said docking port includes at least one flip-flop and at least one multiplexor.

4. The programmable logic device of claim 3, wherein said docking port further includes at least one three-state driver.

5. A programmable logic device, comprising:
   a plurality of sub-arrays, each of said plurality of sub-arrays including at least one logic module;
   a standard interconnection grid linking said plurality of sub-arrays, said standard interconnection grid including vertical routing lines, horizontal routing lines, and local routing lines; and an omniversal bus adjacent to said plurality of sub-arrays, said plurality of sub-arrays including links to said omniversal bus such that said omniversal bus dynamically establishes autonomous sub-arrays of different sizes attached to said omniversal bus.

6. The programmable logic device of claim 5, wherein said links include a docking port.

7. The programmable logic device of claim 6, wherein said docking port includes at least one flip-flop and at least one multiplexor.

8. The programmable logic device of claim 7, wherein said docking port further includes at least one three-state driver.

9. A method of creating a programmable logic device, comprising the steps of:

defining an array of logic modules;

interconnecting said array of logic modules in a grid link, said grid link including vertical routing lines, horizontal routing lines, and local routing lines;

attaching an omniversal bus selectively to said array of logic modules; and dynamically establishing variably sized autonomous sub-arrays of logic modules attached to said omniversal bus.

10. The method of claim 9, said attaching step includes attaching said omniversal bus to each of said array of logic modules.

11. A method for creating a programmable logic device, comprising the steps of:

defining a plurality of sub-arrays, each sub-array of said plurality of sub-arrays including at least one logic module;

interconnecting said plurality of sub-arrays in a grid link, said grid link including vertical routing lines, horizontal routing lines, and local routing lines;

attaching an omniversal bus to said plurality of sub-arrays; and dynamically establishing autonomous sub-arrays of different sizes connected said omniversal bus.

* * * * *

UNITED STATES PATENT AND TRADEMARK OFFICE
CERTIFICATE OF CORRECTION

PATENT NO. : 6,333,641 B1
DATED : December 25, 2001
INVENTOR(S) : Stephen L. Wasson It is certified that error appears in the above-identified patent and that said Letters Patent is hereby corrected as shown below:

Column 1,
Line 28, after "implemented", delete "a s" and replace with -- as --.

Column 5,
Line 2, after "(OCE)", delete "or" and replace with -- and --.
Line 15, after "(ICE)", delete "or" and replace with -- and --.

Signed and Sealed this

Twenty-eighth Day of May, 2002

Attest:

Attesting Officer

JAMES E. ROGAN
Director of the United States Patent and Trademark Office